(12) United States Patent
Burnside et al.

(10) Patent No.: US 7,563,694 B2
(45) Date of Patent: Jul. 21, 2009

(54) SCRIBE BASED BOND PADS FOR INTEGRATED CIRCUITS

(75) Inventors: Andrew Burnside, Glasgow (GB); Albert Dye, Coatbridge (GB); Hugh Dick, Glasgove (GB)

(73) Assignee: Atmel Corporation, San Jose, CA (US)

( * ) Notice: Subject to any disclaimer, the term of this patent is extended or adjusted under 35 U.S.C. 154(b) by 47 days.

(21) Appl. No.: 11/607,564

(22) Filed: Dec. 1, 2006

(65) Prior Publication Data

US 2008/0128690 A1    Jun. 5, 2008

(51) Int. Cl.
*H01L 21/00* (2006.01)

(52) U.S. Cl. .................. 438/462; 438/68; 438/113; 438/114; 438/458; 257/620; 257/E21.596; 257/E21.599

(58) Field of Classification Search .................. 438/14, 438/18, 114, 68, 113, 458, 462–463, 460–461, 438/FOR. 386, 464–465; 324/763; 257/620, 257/E21.596, E21.599
See application file for complete search history.

(56) References Cited

U.S. PATENT DOCUMENTS

| | | | |
|---|---|---|---|
| 5,767,565 A | 6/1998 | Reddy | |
| 6,054,772 A | 4/2000 | Mostafazadeh et al. | |
| 6,403,448 B1 | 6/2002 | Reddy | |
| 6,404,217 B1 | 6/2002 | Gordon | |
| 6,680,484 B1 | 1/2004 | Young | |
| 6,686,224 B2 * | 2/2004 | Higashi | 438/113 |
| 6,829,727 B1 | 12/2004 | Pawloski | |
| 6,963,511 B2 * | 11/2005 | Ashizawa | 365/200 |
| 7,075,107 B2 | 7/2006 | Chen et al. | |
| 7,224,176 B2 * | 5/2007 | Ryu et al. | 324/763 |
| 7,316,935 B1 * | 1/2008 | Hata | 438/11 |
| 2001/0023979 A1 * | 9/2001 | Brouvillette et al. | 257/622 |
| 2002/0130591 A1 * | 9/2002 | Fraser | 310/334 |
| 2003/0025116 A1 | 2/2003 | Higgins, Jr. et al. | |
| 2003/0215966 A1 | 11/2003 | Rolda, Jr. et al. | |
| 2004/0089282 A1 | 5/2004 | Akram et al. | |
| 2005/0230005 A1 | 10/2005 | Liang et al. | |
| 2005/0239268 A1 | 10/2005 | Pirkle et al. | |
| 2006/0001144 A1 | 1/2006 | Uehling et al. | |
| 2006/0103402 A1 * | 5/2006 | Kondou | 324/754 |

FOREIGN PATENT DOCUMENTS

JP    2006-140303    *   6/2006

* cited by examiner

*Primary Examiner*—W. David Coleman
*Assistant Examiner*—Su C Kim
(74) *Attorney, Agent, or Firm*—Schwegman, Lundberg & Woessner P.A.

(57) ABSTRACT

A method and system for utilizing a semiconductor wafer is disclosed. The wafer comprises a plurality of semiconductor die and a plurality of scribe areas interspersed between. The method and system comprises forming bond out pads in the scribe areas such that the bond out pads are disposed on the semiconductor wafer between the plurality of semiconductor die. Additionally, the method and system comprises separating the semiconductor wafer into individual die such that when the semiconductor wafer is separated in a first manner at least one product die is provided. Furthermore, when the semiconductor wafer is separated in a second manner at least one test die is provided.

19 Claims, 3 Drawing Sheets

SCRIBE BASED BOND PADS FOR INTEGRATED CIRCUITS

FIELD OF THE INVENTION

The present invention relates generally to semiconductor devices and specifically to a method of separating product and test die from a semiconductor wafer.

BACKGROUND OF THE INVENTION

Many microcontrollers and microprocessors contain embedded memories such as ROM. Typically, it is not possible to modify the memory of embedded ROM after manufacture. In the case of Write Once Memory, it is only possible to modify the memory once.

It is standard in the industry to develop software applications for embedded processors. In order to develop and test software on real-time (or full speed) silicon it is necessary to bond out the read only memory on externally accessible bond out pads. The internal memory is isolated and replaced by external memory connected to the bond out pads.

Currently, manufacturers use bond out memory in development silicon. However, the standard approach requires that the provision of bond out pads occupy a significant amount of silicon area, resulting in a significant increase in product cost. Manufacturers have addressed this issue by either absorbing the costs or by manufacturing two variants of silicon, one for development purposes that includes bond out pads and a production version that does not include bond out pads. Both approaches lead to an increase cost of production.

Accordingly, what is desired is a cost-efficient method of manufacturing semiconductor wafers that can be used for both product and development purposes. The present invention addresses this need.

BRIEF SUMMARY OF THE INVENTION

A method and system for utilizing a semiconductor wafer is disclosed. The wafer comprises a plurality of semiconductor die and a plurality of scribe areas interspersed between. The method and system comprises forming bond out pads in the scribe areas such that the bond out pads are disposed on the semiconductor wafer between the plurality of semiconductor die. Additionally, the method and system comprises separating the semiconductor wafer into individual die such that when the semiconductor wafer is separated in a first manner at least one product die is provided. Furthermore, when the semiconductor wafer is separated in a second manner at least one test die is provided.

Accordingly, it is an advantage of the present invention to provide separation methods that provide either a plurality of product die or a plurality of test die from a semiconductor wafer.

BRIEF DESCRIPTION OF SEVERAL VIEWS OF THE DRAWINGS

The present invention is illustrated by way of example and not limitation in the figures of the accompanying drawings, in which like references indicate similar elements, and in which.

DETAILED DESCRIPTION OF THE INVENTION

The present invention relates generally to semiconductor devices and specifically to a method of separating product and test die from a semiconductor wafer. The following description is presented to enable one of ordinary skill in the art to make and use the invention and is provided in the context of a patent application and the generic principles and features described herein will be readily apparent to those skilled in the art. Thus, the present invention is not intended to be limited to the embodiments shown, but is to be accorded the widest scope consistent with the principles and features described herein.

Figure 1:
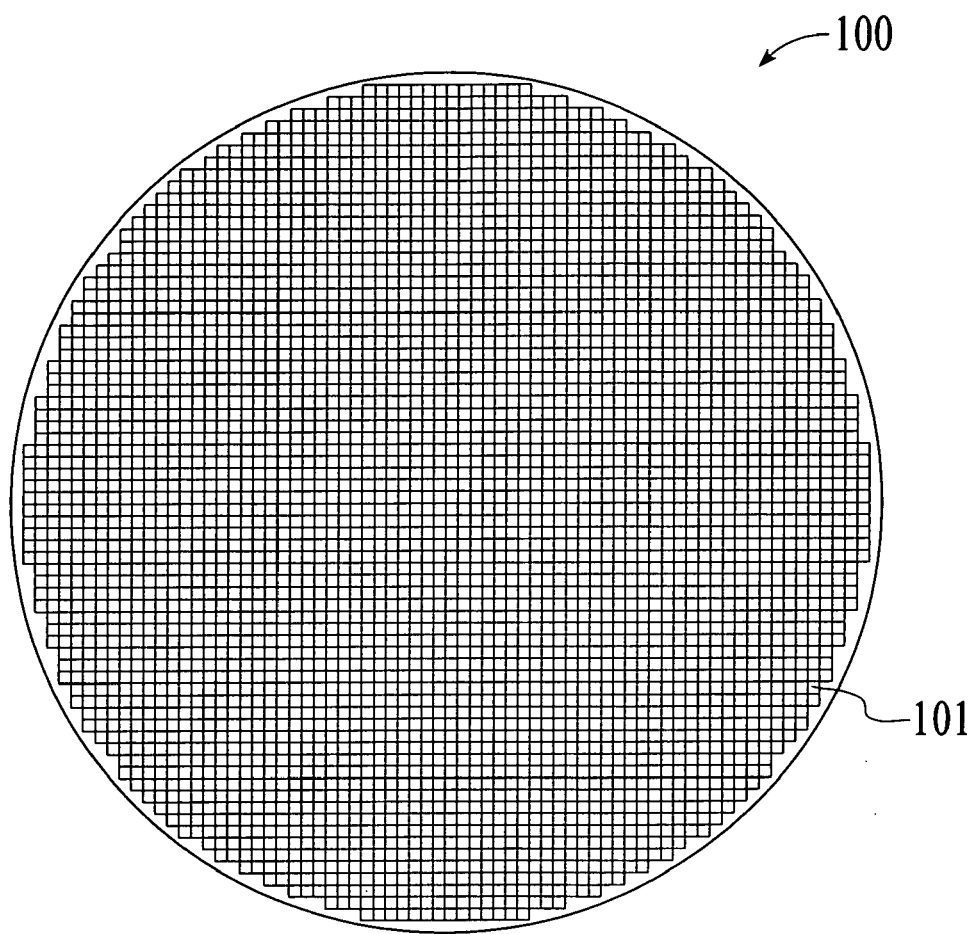
FIG. 1 shows a top version of a semiconductor wafer which features a plurality of semiconductor die, represented by small squares.

FIG. 1 shows a top view of a semiconductor wafer 100 that features a plurality of semiconductor die 101, denoted by small squares. Semiconductor 100 also features bond out pads and test circuitry (shown in subsequent figures). A semiconductor wafer 100 may be designated as a product or test/development wafer. In the event semiconductor wafer 100 is designated for product, the semiconductor die is subsequently separated into individual semiconductor die, which includes destructively removing the test circuitry and bond out pads disposed in the scribe area. Alternatively, in the event that a semiconductor wafer is designated for testing, test dice are separated by sawing through adjacent semiconductor dice while maintaining the integrity of the test circuitry and bond out pads.

According to an embodiment, the term "separating" (and other verb tenses of the term) refers to a process of partitioning a semiconductor wafer into individual, semiconductor die or dice. The term may also be referred to as singulating, dividing, or severing.

For an embodiment, each semiconductor die 101 disposed on semiconductor wafer 100 are identical and each contain memory circuitry for storing data securely. For the embodiment, semiconductor die 101 is a microcontroller and the memory circuit is provided in the form of read-only memory (ROM). For alternative embodiments, semiconductor die 101 is a microprocessor.

For an embodiment, semiconductor wafer 100 is processed using conventional semiconductor fabrication techniques to form semiconductor die 101 thereon. During the fabrication of semiconductor die 101, test circuitry and bond out pads are also formed, according to an embodiment.

As stated previously, a semiconductor wafer may be designated as a product or test/development wafer. In the event a semiconductor wafer is designated for product, the semiconductor die is subsequently separated into individual semiconductor die, which includes destructively removing the test circuitry and bond out pads disposed in the scribe areas.

Figure 2:
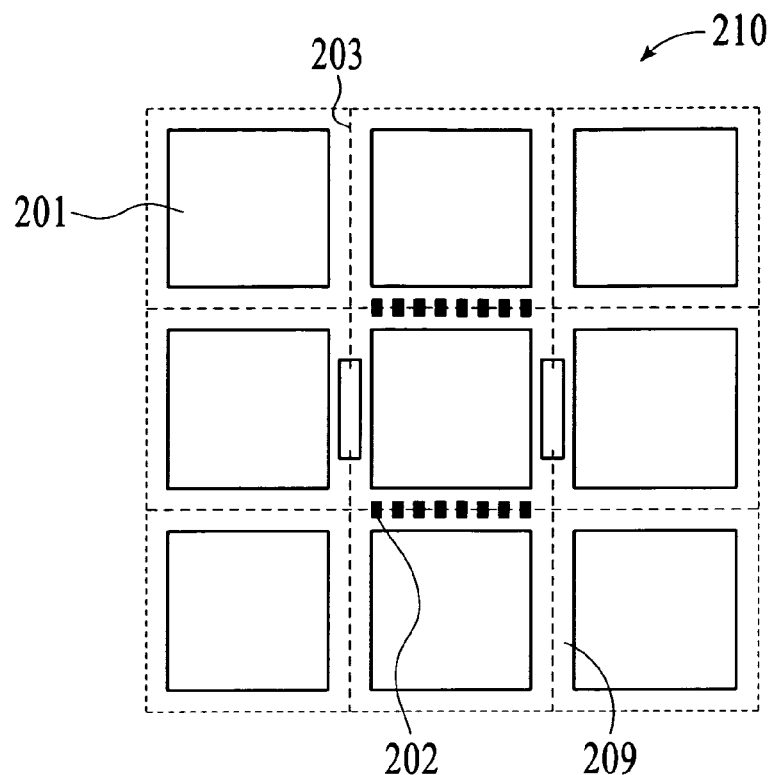
FIG. 2 shows a magnified area of a 3×3 semiconductor die cluster and bond out pad circuitry in a scribe area on a semiconductor wafer.

FIG. 2 shows an example layout of a 3×3 semiconductor die cluster 210 when a semiconductor wafer is designated for product. Those having ordinary skill in the art will appreciate that this layout is not limited to a 3×3 semiconductor die cluster and that a semiconductor die cluster may incorporate more or less semiconductor dice thereon. For the embodiment when a semiconductor wafer is designated for product, the semiconductor wafer is separated into individual semiconductor dice 201. Separating a semiconductor wafer into individual semiconductor dice 201 may be achieved by use of a sawing technique, laser obliteration, diamond scribe or additional wafer processing techniques such as selective chemical etching. For an embodiment, a sawing technique is used to separate a semiconductor wafer into individual semiconductor dice for product.

For the embodiment when a sawing technique is used, a first sawing procedure is made along a set of scribe lines 203 in scribe area 209. For embodiments, scribe area 209 has a width of approximately 70 microns. In other words, the space between adjacent semiconductor die disposed on a semiconductor wafer is at least approximately 70 microns. In the first sawing procedure, a saw blade having a width less than the width of scribe area 209 is used to cut a shallow depth sufficient to cut into the surface of a semiconductor wafer, but not so deep as to cut completely through the semiconductor wafer. For the embodiment, this sawing procedure destructively removes the test circuitry and bond out pads 202 in scribe area 209.

Next, according to an embodiment, a semiconductor wafer is subjected to a second sawing procedure such that a second cut is made along the path made by the first saw cut within scribe area 209. For an embodiment, a saw blade having a narrow width is used to cut completely through the semiconductor wafer. The second sawing procedure thus completely severs and separates the wafer into individual semiconductor dice, which provides enhancing security against unauthorized access.

It will be appreciated that since the test circuitry and bond out pads 202 have been removed from their respective device dies, at this point no further testing of the device is ordinarily possible. It will be further appreciated that since the test circuitry and bond out pads 202 are destroyed in their removal, their visual inspection or reverse engineering is made practically impossible, further enhancing security of the devices against access by a hacker. It will also be appreciated that any remaining fragments of test circuitry and bond out pads cannot now be used to probe electrical activity or features of the devices since these fragments of inoperable test circuitry and bond out pads are rendered and remain isolated in the absence of the enabling signals from the test circuitry which was present but which has now been destroyed.

It will be appreciated that although in the above described embodiment features in the form of test circuitry and bond out pads are destructively removed to enhance the security of the finished device, the security of the finished device could be alternatively or additionally enhanced by the destructive removal of other features such as expanded test mode circuitry or circuitry for unscrambling (otherwise scrambled) access to the devices' bus, central processing unit or memory.

Figure 3:
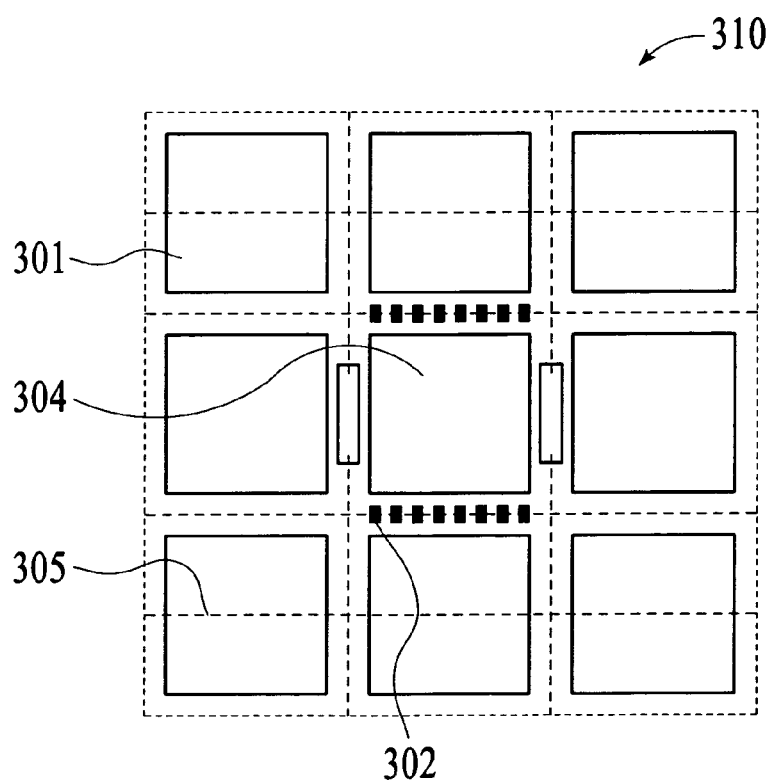
FIG. 3 shows a magnified area of a 3×3 semiconductor die cluster, saw lines on semiconductor dice adjacent to a test/emulation die, and corresponding bond out pads.

For an embodiment, a semiconductor wafer may be designated for testing or emulation. FIG. 3 shows a magnified area of a 3×3 semiconductor die cluster 310, saw lines 305 projected on semiconductor dice 301 adjacent to a test/emulation die 304, and corresponding bond out pads 302. For an embodiment, a semiconductor wafer designated for test or emulation undergoes a separation process relative to the separation process used to separate die disposed on product wafers, as described above.

For an embodiment when a semiconductor wafer is designated a test or emulation wafer, a subsequent separation procedure is in accordance with the following: a first sawing procedure along saw lines 305 projected on semiconductor dice 301 to a pre-determined depth such that grooves are cut in adjacent semiconductor dice 301; a second sawing procedure along the grooves formed by the first sawing procedure such that the adjacent semiconductor dice 301 are severed in halves, fourths, or any fraction of the original size of semiconductor dice 301.

Figure 4:
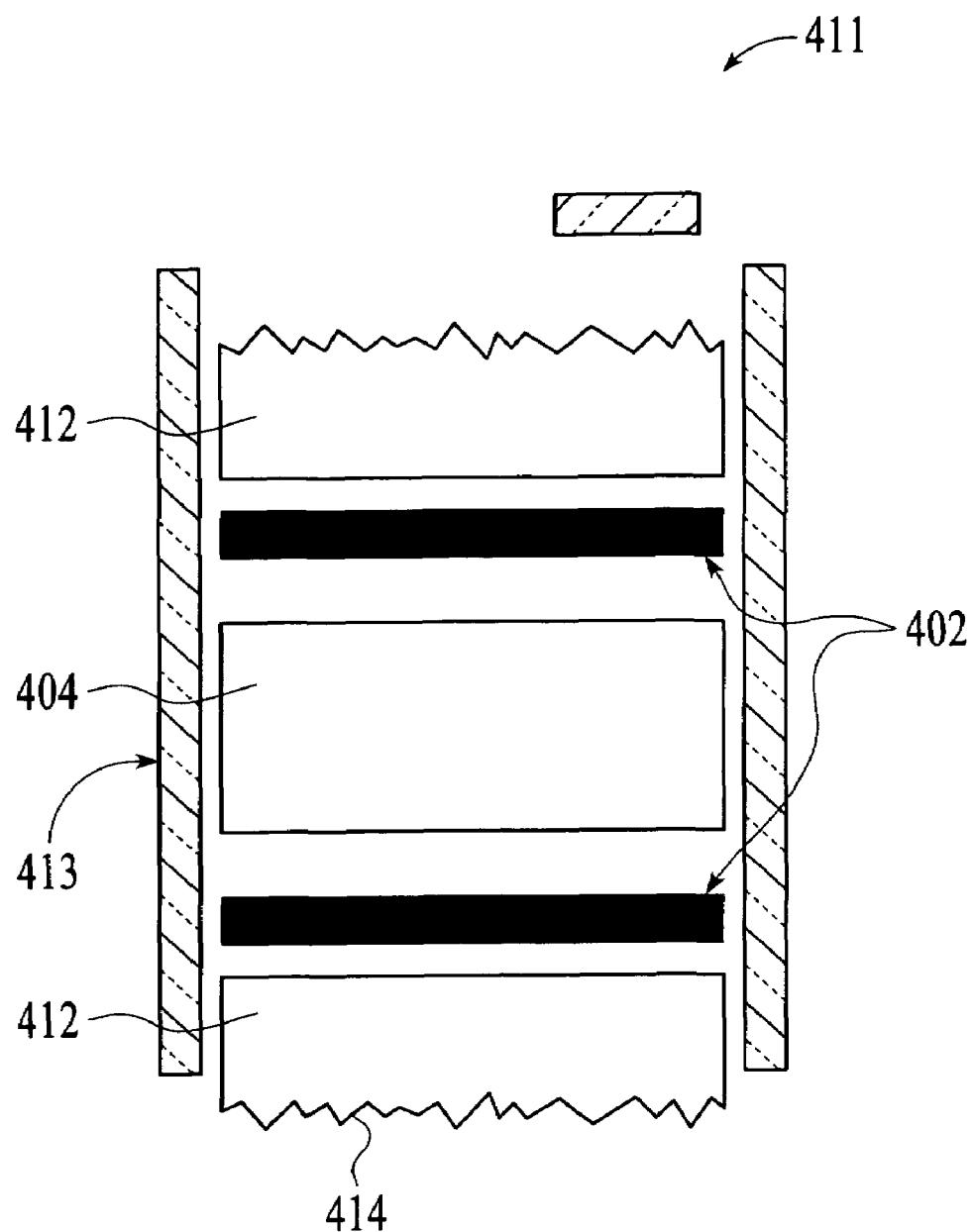
FIG. 4 shows a sawn semiconductor wafer structure featuring an emulation/test die with corresponding bond out pads, test circuitry, and adjacent, sawn- semiconductor dice.

FIG. 4 shows a sawn-semiconductor wafer structure 411 featuring an emulation/test die 404 with corresponding bond out pads 402, test circuitry 413, and adjacent, sawn-semiconductor dice 412. As shown, emulation/test die 404 is separated from its parent semiconductor wafer, while the structural integrity of bond out pads 402 and test circuitry 413 remain intact. Additionally, FIG. 4 shows a jagged edge 414, which signifies the aforementioned sawing procedure. For an embodiment, a "jagged edge" is defined as any uneven surface. For example, adjacent, sawn-semiconductor dice 412 may have jagged edges due to the saw-cutting method described above.

It will be further appreciated that the bond out pads may be manufactured such that electrostatic damage (ESD) is minimized. ESD is typically caused by charge build-up in interconnects within semiconductor devices. Often, charges are introduced within semiconductor devices during fabrication processes, such as, but not limited to chemical mechanical polishing, interlayer dielectric etch, and plasma deposition or etch. For an embodiment, ESD protection may be achieved by forming a salicide layer on drain regions and embedding antenna diodes within the bond out pad device.

Typically, devices are conventionally manufactured with ESD protection for human handling (approximately 6 kV), or machine model (approximately 200V). This is necessary for protection/yield reason. For the scribe bond pad application, there is limited available space in the scribe area for placement of bond pads, buffer circuit, and ESD protection circuitry. For semiconductor wafers that have been designated for emulation, the size of ESD protection circuitry can be reduced to allow more space for bond pads and complementary circuitry (buffer and ESD protection circuitry) within the scribe area. For an embodiment, the ESD protection circuitry may be lowered below a level that is acceptable for production devices. However, for embodiments, a reduction in ESD protection is a less critical for emulation (test die) as the volumes of die for testing is small relative to the large volume of production die.

For various embodiments, ESD protection circuitry may be disposed adjacent to or under the bond out pads such that ESD protection is provided.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method, comprising:
   providing a semiconductor wafer having a first portion with semiconductor dice and a second portion separate from the first portion, the second portion having a scribe area;
   forming bond out pads completely within the scribe area and along a scribe line; and
   separating the semiconductor wafer into individual die, wherein separating the semiconductor wafer in a first manner yields at least one product die, and wherein separating the semiconductor wafer in a second manner yields at least one test die, the second manner including cutting through at least one of the semiconductor dice adjacent the test die to leave a portion of the at least one adjacent semiconductor die attached to the test die.

2. The method of claim 1, wherein the first manner comprises sawing along the scribe area.

3. The method of claim 1, wherein the second manner comprises sawing through two semiconductor dice that are each adjacent to the test die to leave a portion of each of the adjacent semiconductor dice attached to the test die.

4. The method of claim 1, wherein forming bond out pads in the scribe area occurs while fabricating the semiconductor wafer.

5. The method of claim 1, wherein the semiconductor wafer is separated by a method including one or a combination of sawing, laser obliteration, diamond scribe, and selective chemical etching.

6. The method of claim 1, wherein separating the semiconductor comprises a first sawing procedure and a second sawing procedure.

7. The method of claim 6, wherein the first sawing procedure comprises sawing the semiconductor wafer to a predetermined depth such that grooves are cut in the semiconductor wafer.

8. The method of claim 7, wherein the second sawing procedure comprises sawing the semiconductor wafer along the grooves formed by the first sawing procedure such that the semiconductor wafer is severed.

9. A method, comprising:
providing a semiconductor wafer having a first portion with semiconductor dice and a second portion separate from the first portion, the second portion having a scribe area;
forming bond out pads in the scribe area; and
separating the semiconductor wafer into individual die, wherein a test die is separated from the semiconductor wafer by sawing through at least one of the semiconductor dice adjacent the test die to leave a portion of the at least one adjacent semiconductor die attached to the test die.

10. The method of claim 9, wherein test circuitry is coupled to the test die.

11. A method, comprising:
providing a semiconductor wafer having multiple die arranged in an array with first scribe areas separating the die;
forming bond out pads for at least one die completely within a selected scribe area and along a scribe line;
selecting whether to obtain a test die or a product die from the at least one die on the semiconductor wafer;
if a test die is selected, separating the test die from the semiconductor wafer while preserving the bond out pads, wherein separating the test die includes cutting through at least one die adjacent the test die to leave a portion of the at least one adjacent die attached to the test die; and
if a product die is selected, separating the product die from the semiconductor wafer along the scribe areas in a manner that removes the bond out pads.

12. The method of claim 11 and further comprising:
forming test circuitry in a selected scribe area; and
selectively removing or retaining the test circuitry during separation of the selected die as a function of the selection of a test or product die.

13. The method of claim 11 wherein separating the product die comprises sawing in the selected scribe area having bonding pads such that the sawing removes substantially all of the bond out pads.

14. The method of claim 11 wherein separating the test die comprises sawing the semiconductor wafer outside the selected scribe area such that the bond out pads are not removed.

15. The method of claim 14 wherein the at least some of the sawing occurs across a die adjacent to the test die.

16. The method of claim 11 wherein die are separated by a method including one or a combination of sawing, laser obliteration, diamond scribe, and selective chemical etching.

17. The method of claim 11 wherein the bond out pads are formed in multiple scribe areas adjacent the test die.

18. The method of claim 11 comprising forming test circuitry in multiple scribe areas adjacent the test die.

19. A method, comprising:
providing a semiconductor wafer having multiple die arranged in an array with first scribe areas separating the die;
forming bond out pads, test circuitry, or development circuitry for at least one die in a selected scribe area, wherein the bond out pads are formed completely within the selected scribe area and along a scribe line;
selecting whether to obtain a test die or a product die from the at least one die on the semiconductor wafer;
if a test die is selected, separating the test die from the semiconductor wafer while preserving the bond out pads, test circuitry, or development circuitry, wherein separating the test die includes cutting through at least one die adjacent the test die to leave a portion of the at least one adjacent die attached to the test die; and
if a product die is selected, separating the product die from the semiconductor wafer along the scribe areas in a manner that removes the bond out pads, test circuitry, or development circuitry.

* * * * *

UNITED STATES PATENT AND TRADEMARK OFFICE
CERTIFICATE OF CORRECTION

PATENT NO. : 7,563,694 B2
APPLICATION NO. : 11/607564
DATED : July 21, 2009
INVENTOR(S) : Andrew Burnside et al.

Page 1 of 1

It is certified that error appears in the above-identified patent and that said Letters Patent is hereby corrected as shown below:

In column 4, line 21, in Claim 15, after "wherein" delete "the".

Signed and Sealed this

Twenty-ninth Day of December, 2009

David J. Kappos
*Director of the United States Patent and Trademark Office*